United States Patent
Shende et al.

(10) Patent No.: US 12,525,994 B1
(45) Date of Patent: Jan. 13, 2026

(54) DECODER-ASSISTED LLR CALCULATION

(71) Applicant: Marvell Asia Pte Ltd, Singapore (SG)

(72) Inventors: Nirmal Shende, Manteca, CA (US); Nedeljko Varnica, San Jose, CA (US)

(73) Assignee: MARVELL ASIA PTE LTD, Singapore (SG)

( * ) Notice: Subject to any disclaimer, the term of this patent is extended or adjusted under 35 U.S.C. 154(b) by 114 days.

(21) Appl. No.: 18/528,945

(22) Filed: Dec. 5, 2023

Related U.S. Application Data

(60) Provisional application No. 63/438,775, filed on Jan. 12, 2023.

(51) Int. Cl.
*H03M 13/00* (2006.01)
*H03M 13/15* (2006.01)

(52) U.S. Cl.
CPC .............................. *H03M 13/1575* (2013.01)

(58) Field of Classification Search
CPC .......... H03M 13/1108; H03M 13/1111; H03M 13/45
See application file for complete search history.

(56) References Cited

U.S. PATENT DOCUMENTS

| | | | | |
|---|---|---|---|---|
| 8,335,977 | B2* | 12/2012 | Weingarten | G11C 11/5621 714/794 |
| 9,160,373 | B1* | 10/2015 | Varnica | H03M 13/1102 |
| 10,084,481 | B2* | 9/2018 | Sommer | H03M 13/2963 |
| 10,511,326 | B2* | 12/2019 | Chang | H03M 13/1108 |
| 11,355,216 | B1* | 6/2022 | Wu | G11C 16/26 |
| 2010/0251076 | A1* | 9/2010 | Wu | H03M 13/6516 714/780 |
| 2013/0275829 | A1* | 10/2013 | Sridhara | H03M 13/1111 714/755 |
| 2018/0373591 | A1* | 12/2018 | Barndt | H03M 13/3707 |
| 2020/0373944 | A1* | 11/2020 | Cho | G06F 11/1048 |

\* cited by examiner

*Primary Examiner* — Esaw T Abraham

(57) ABSTRACT

A method for decoding data in a memory device includes attempting to decode, using a first decoder, initial bits based on original data read from memory, determining that the first decoding was not successful, and, in response to determining that the first decoding was not successful, attempting to decode, using a second decoder, the initial bits based on the original data and information derived during the first decoding. The first decoder may be a hard decoder, and the second decoder may be a soft decoder. The information derived during the first decoding may include soft information corresponding to each of the initial bits. The soft information may include LLR values corresponding to each of the initial bits. Alternatively, the information derived during the first decoding may include a syndrome weight, and the soft information may be based on the syndrome weight.

14 Claims, 6 Drawing Sheets

DECODER-ASSISTED LLR CALCULATION

CROSS REFERENCE TO RELATED APPLICATION

This disclosure claims the benefit of commonly-assigned U.S. Provisional Patent Application No. 63/438,775, filed Jan. 12, 2023, which is hereby incorporated by reference herein in its entirety.

FIELD OF USE

This disclosure relates to improved decoding of bit values in memory devices. More particularly, this disclosure relates to soft decoding (as needed) based on soft information derived from data from a failed decoding attempt.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

Typically, soft decoding has heretofore been based on original data stored in memory. If that original data is corrupted (e.g., due to write, read, or storage errors), then such soft decoding may fail to decode the original data stored in memory.

SUMMARY

In accordance with implementations of the subject matter of this disclosure, a method for decoding data in a memory device includes attempting to decode, using a first decoder, initial bits based on original data read from memory, determining that the first decoding was not successful, and, in response to determining that the first decoding was not successful, attempting to decode, using a second decoder, the initial bits based on the original data and information derived during the first decoding.

In a first implementation of such a method, using the first decoder may include using a hard decoder, and using the second decoder may include using a soft decoder.

In a second implementation of such a method, attempting to decode, using a second decoder, the initial bits, based on the original data and the information derived during the first decoding, includes deriving, based on the information derived during the first decoding, soft information corresponding to each bit of the initial bits.

According to a first aspect of that second implementation, the soft information may include LLR values corresponding to each bit of the initial bits.

According to a second aspect of that second implementation, the information derived during the first decoding may include a syndrome weight, and deriving the soft information corresponding to each bit of the initial bits may include deriving the soft information corresponding to each bit of the initial bits based on the syndrome weight.

In a third implementation of such a method, attempting to decode the initial bits may include changing at least one initial bit into at least one flipped bit by changing its binary value, and writing a bit vector including data indicative of which one or more bits of the initial bits were changed into the at least one flipped bit.

According to a first aspect of that third implementation, attempting to decode, using a second decoder, the initial bits, based on the original data and the information derived during the first decoding, may include attempting to decode, using a second decoder, the initial bits based on the original data, and the at least one flipped bit.

A first instance of that first aspect may further include lowering a value indicative of a probability of an accurate decoding for each bit of the at least one flipped bit.

A second instance of that first aspect may further include raising a value indicative of a probability of an accurate decoding for each bit other than the at least one flipped bit.

A fourth implementation of such a method may further include determining a syndrome weight based on the first decoding, where determining that the first decoding was not successful may include comparing the syndrome weight to a predetermined threshold value.

In accordance with implementations of the subject matter of this disclosure, a memory device includes a plurality of memory cells, a first decoder configured to decode initial bits based on original data from memory cells, and to determine whether the first decoding of the initial bits was successful, and a second decoder configured to, in response to the first decoder determining that the first decoding was not successful, decode the initial bits based on the original data and information derived by the first decoder.

In a first implementation of such a memory device, the first decoder is a hard decoder and the second decoder is a soft decoder.

A second implementation of such a memory device may further include a soft information calculator configured to derive, based on the information derived by the first decoder, soft information corresponding to each bit of the initial bits, where the second decoder decodes the initial bits based on the original data and the soft information.

According to a first aspect of that second implementation, the soft information calculator may be configured to derive LLR values corresponding to each bit of the initial bits.

According to a second aspect of that second implementation, the information derived by the first decoder may include a syndrome weight, and the soft information calculator is configured to derive the soft information corresponding to each bit of the initial bits based on the syndrome weight.

In a third implementation of such a memory device, the first decoder may be further configured to derive at least one flipped bit from at least one initial bit by changing the binary value of the at least one initial bit, and to write a bit vector comprising data indicative of which one or more bits of the initial bits were changed into the at least one flipped bit.

A first aspect of that third implementation may further include a soft information calculator configured to derive soft information based on the at least one flipped bit derived by the first decoder, where the second decoder may decode the initial bits based on the original data and the soft information.

In a first instance of that first aspect, the soft information calculator may be further configured to lower a value indicative of a probability of an accurate decoding for each bit of the at least one flipped bit.

In a second instance of that first aspect, the soft information calculator is configured to raise a value indicative of a probability of an accurate decoding for each bit other than the at least one flipped bit.

In a fourth implementation of such a memory device, the first decoder may be further configured to determine a syndrome weight based on the first decoding, and determine that the first decoding was not successful by comparing the syndrome weight to a predetermined threshold value.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

Figure 1:
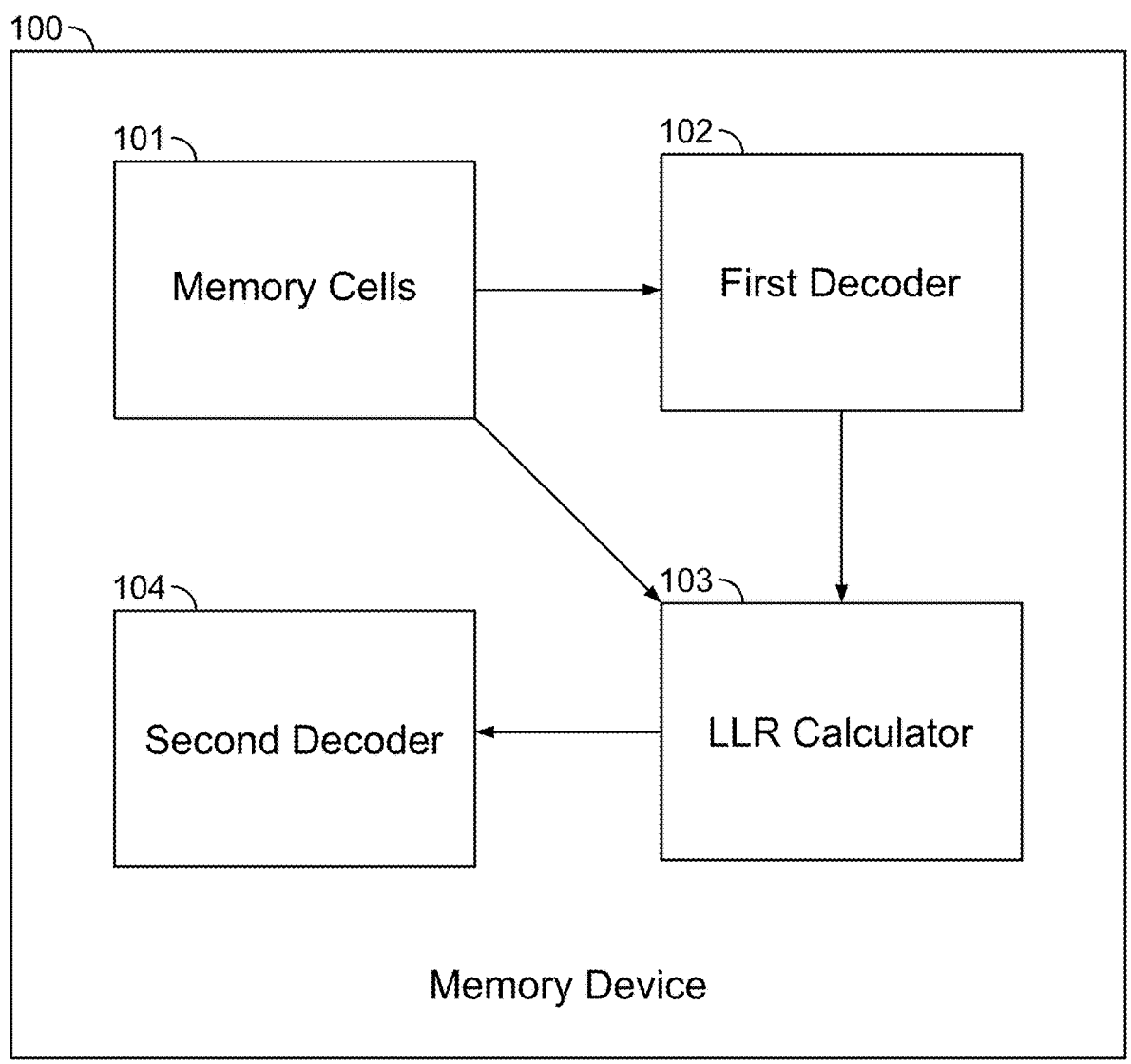
FIG. 1 is a high-level block diagram of a memory device that uses prior information from a decoder to perform a soft decoding, in accordance with implementations of the subject matter of this disclosure.

In some memory devices (e.g., those based on NAND Flash memory), previously stored bit values may be corrupted due to many factors, including, but not necessarily limited to, signal noise, device aging, voltage fluctuations, extreme temperature conditions, or any combination thereof. For that reason, processes for reading such bit values may include error-correcting processes to correct the values of any corrupted bits. After an initial decoding process, the memory device may execute one or more error-checking processes to determine whether the initial, or first, decoding was successful. If that first decoding was unsuccessful, the memory device may attempt additional decoding, error-correcting, and error-checking processes until the bit values are successfully decoded.

For example, a multi-stage decoding process may include use of a first decoder (e.g., a hard decoder) and use of a second decoder (e.g., a soft decoder). As used herein, "hard decoder" refers to a decoder that operates on hard information (i.e., binary values) corresponding to the input bits, while "soft decoder" refers to a decoder that operates on soft information (e.g., LLR values or other probabilistic values) corresponding to the input bits. Both decoders may operate on bit values stored in memory and may include some capability to correct and check for errors. Compared to the first decoder, the second decoder may offer superior error correction capabilities but slower execution speed. Therefore, it may be desirable to initially attempt a decoding using the first decoder and to attempt a second decoding using the second decoder only in response to a failure of the initial attempt.

As part of such a multi-stage decoding process, use of the first decoder may include reading initial bits from memory and attempting to decode those initial bits. After the decoding attempt is executed, the first decoder may output decoded bit values and data indicating whether the decoding was successful (e.g., based on the outcome of an error-checking process executed after the decoding attempt). For example, the data indicating whether the decoding was successful may be a syndrome weight, or the existence of one or more flipped bits in the output of an error-correcting process. If the first decoder is unsuccessful, then the process may include activating a second decoder to attempt to decode the same bits.

The second decoder may have superior error-correcting capabilities as compared to the first decoder. Therefore, the second decoder may succeed even though the first decoder failed. For example, the first decoder may operate on hard information while the second decoder operates on soft information, or the first decoder may operate on lower-resolution soft information while the second decoder operates on higher-resolution soft information. In implementations according to the subject matter of this disclosure, the second decoder may successfully decode the bits by taking into account information (e.g., soft information) derived from the failed first decoding operation, in addition to the original data read from memory.

When the soft decoder is a second decoder—i.e., is making a second attempt at decoding certain data, there may be information available from the first decoder that can be relied on in deriving the soft information to be used by the second decoder. Therefore, soft information used by a soft decoder may be derived from data derived during a prior decoding operation, from the data to be decoded, or from a combination thereof. For example, initial soft information may be derived from data to be decoded, and the initial soft information may then be modified based on data derived from error-detection and/or error-correction processes as may have been performed by the first decoder.

As mentioned above, the soft information may be a log-likelihood ratio (LLR), which may be defined as the relationship between the probability ($P_0$) of a bit being '0' and the probability ($P_1$) of a bit being '1':

$$LLR = L = \log\left(\frac{P_1}{P_0}\right)$$

$$P_1 + P_0 = 1$$

$$P_0 = \frac{1}{(1+e^L)}$$

$$P_1 = \frac{e^L}{(1+e^L)}$$

A relatively large absolute value of an LLR (e.g., greater than 40) may indicate a high probability that a bit has been successfully decoded (i.e., reliability of the decoded bit). The sign of an LLR (i.e., positive or negative) may indicate whether the bit is more probably a '0' or a '1'. A soft decoder may use soft information to decode bit values stored in memory, e.g., by probabilistically determining the bit values based on the signs and magnitudes of LLR values corresponding to the bits.

In accordance with implementations of the subject matter of this disclosure, a memory decoding process may include use of a second decoder that uses information derived from a first decoder to decode bit values stored in memory. In some implementations, the process also includes use of an LLR calculator that calculates initial LLR values based on original data stored in memory and then adjusts the initial LLR values based on information from the first decoder. The LLR calculator may be activated in response to the first decoder executing an unsuccessful first decoding of the bit values. The LLR calculator provides the LLR values to the second decoder, which operates on the LLR values to decode the values of the bits stored in memory.

Operation of the first decoder may include execution of one or more error-correcting processes (e.g., flipping bits) and one or more error-checking processes (e.g., determining a syndrome weight or quantifying a number of flipped bits). Based on the outcome of the error-correcting and/or error-checking process, the LLR calculator may adjust its LLR calculation. For example, the LLR calculator may adjust first LLR values (e.g., based on reading signals encoding bits into memory cells) into adjusted LLR values, where the parameters of the adjustment are determined by the outcome of the error-correcting and/or error-checking process of the first decoder. When the error-correcting process involves bit flipping (i.e., a decoder provides an output in which one or more respective input bit values have been changed from one of a '0' or a '1' to the other one of a '0' or a '1'), the LLR calculator may adjust the LLR values corresponding to each of the one or more flipped bit values and may also adjust the LLR values corresponding to each of the remaining unflipped (i.e., initial) bit values.

Thus, the LLR calculator uses information from the first decoder to indicate that soft information describing respective bit values is more or less reliable. In some implementations, the LLR calculator may lower an absolute value of an LLR corresponding to a flipped bit value, thereby indicating a reduced probability of the LLR accurately indicating the value of the one or more flipped bit. Moreover, the LLR calculator may raise an absolute value of an LLR corresponding to an unflipped bit value, thereby indicating an increased probability that the LLR accurately indicates the value of the one or more unflipped bits. In addition, the LLR calculator may change the sign of an LLR corresponding to a bit value (i.e., from positive to negative, or vice versa), thereby indicating that, compared to the initial binary value that was decoded from the original data stored in memory, the bit is more probably the other binary value (i.e., if the original data resulted in an LLR value indicative of a '0', then changing the sign of that LLR value may result in a subsequent decoding of the value as a '1', or vice versa).

As described above, the first decoder may execute one or more error-checking processes (e.g., calculating a syndrome weight based on a low-density parity-check code, turbo code, polar code, or any other suitable technique for hard or soft decoding, or quantifying a number of flipped bits) during its operation. If an error-checking process determines that the first decoder was unsuccessful, then the LLR calculator may be activated. During its operation, the LLR calculator may make adjustments to LLR values based on the outcome of the error-checking process. For example, the LLR calculator may determine a magnitude by which to lower or raise LLR values, including whether to change the sign of an LLR value, based on the syndrome weight or a quantity of flipped bits.

In accordance with implementations of the subject matter of this disclosure, decoder-assisted LLR calculation may be extendable to various decoding architectures beyond those described herein. In some implementations, the first and second decoders may both be soft decoders, where the second decoder may have a higher precision than the first. In some implementations, the first and second decoders may be multi-bit decoders. In some implementations, the multi-stage decoding process may include use of more than two decoders, and any downstream LLR calculation stage (i.e., occurring after the first decoding stage) may use information from any one or more upstream decoding stages to calculate an adjusted LLR to facilitate successful decoding.

The subject matter of this disclosure may be better understood by reference to FIGS. 1-6.

FIG. 1 is a block diagram of components of a memory device 100 showing internal data flows. Memory device 100 includes at least memory cells 101 (e.g., single-level, multi-level, or tri-level NAND memory cells, or NAND memory cells with even more levels, or any other suitable memory cell), a first decoder 102 (e.g., a hard or soft decoder), an LLR calculator 103, and a second decoder 104 (e.g., a soft decoder). As indicated by the arrows, the first decoder 102 reads original data (e.g., bit values or signals encoding bit values) from memory cells 101.

The LLR calculator 103 receives an output from by the first decoder 102. The output of the first decoder 102 may include whether the first decoder 102 completed a successful decoding operation, and it may also include other information from the decoding operation. For example, the output of the first decoder 102 may also include a bit vector, which indicates the existence of flipped bits. Moreover, the output of the first decoder 102 may include a syndrome weight, which indicates the existence of incorrect bits.

Based on an output of the first decoder 102 and original data from memory cells 101, the LLR calculator 103 determines a set of respective LLR values, each value corresponding to a respective bit stored in memory cells 101. In some implementations, based on the original data from memory cells 101, the LLR calculator 103 may determine a first set of LLR values and may then adjust those LLR values based on the output from the first decoder 102.

Based on an output of the LLR calculator 103, a second decoder 104 may decode the original data from memory cells 101 into bit values. For example, the second decoder 104 may probabilistically determine the bit values based on the corresponding LLR values and may subsequently execute an error-checking procedure to verify that those bit values are free of errors, thus indicating a successful decoding. In some implementations, the second decoder 104 may be configured to, based on the LLR values, execute one or more error-correcting processes to correct for any ambiguity that may arise during decoding of the bits based on the LLR values.

In some implementations, the memory device 100 may include additional decoders and/or LLR calculators. In accordance with implementations of the present disclosure, such additional LLR calculators may use data from at least one upstream decoder to generate LLR values that may be provided to at least one downstream decoder. Moreover, though not explicitly shown, the second decoder 104 (and any additional decoders) may also be configured to receive information from memory cells 101, in addition to the information received from LLR calculator 103 and/or any other LLR calculator.

Figure 2:
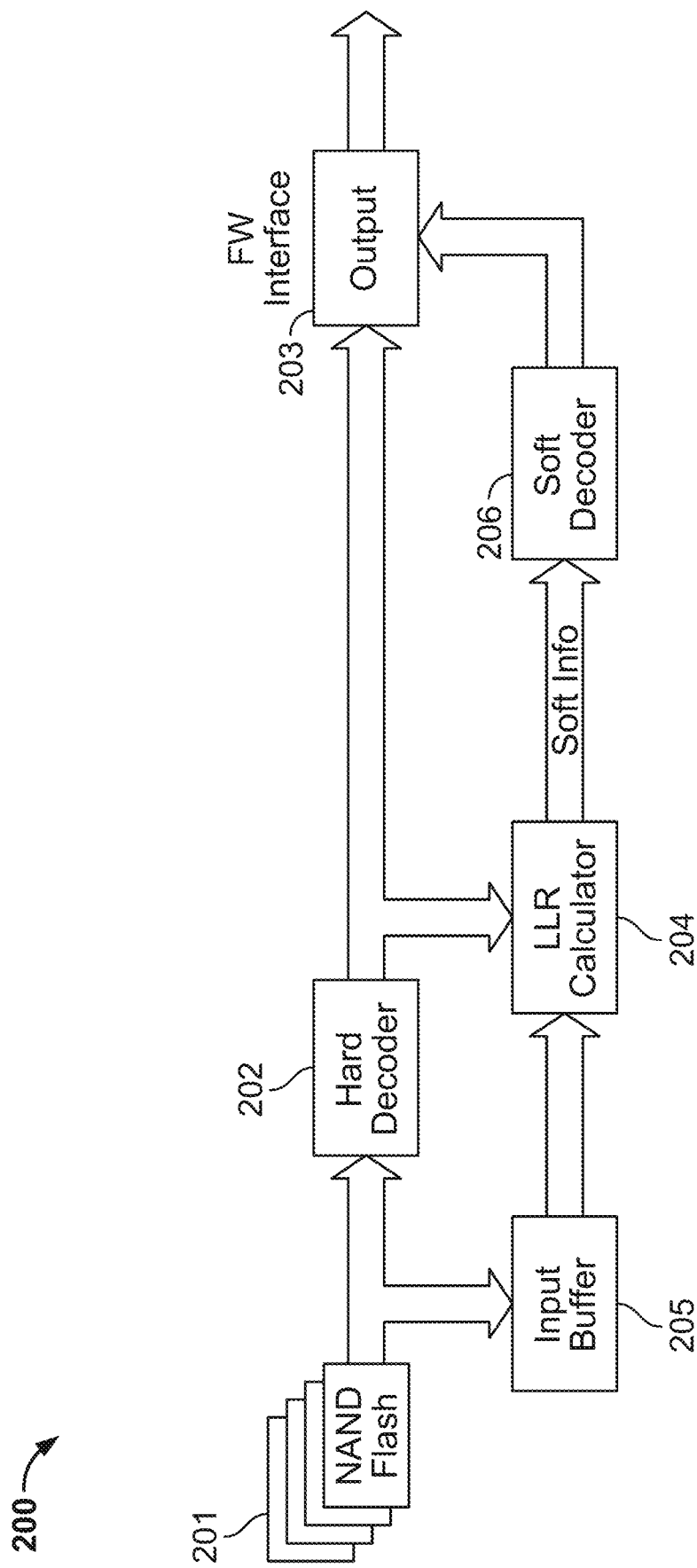
FIG. 2 is a block diagram of data flow in an apparatus that uses prior information from a decoder to perform a soft decoding, in accordance with implementations of the subject matter of this disclosure.

FIG. 2 is a block diagram 200 of a representative apparatus in which LLR calculator 204 uses information from hard decoder 202 to provide more reliable LLR values to soft decoder 206. In this representative apparatus, the memory cells are NAND Flash memory 201, the first decoder is hard decoder 202, and the second decoder is soft decoder 206. The hard decoder 202 receives data stored in NAND Flash memory 201 and attempts to decode corresponding bit values. The hard decoder 202 also indicates whether the decoding attempt was successful. If the decoding was successful, then the hard decoder 202 provides the decoded bits to the firmware interface output 203.

However, if the decoding was not successful, then the hard decoder provides information from the hard decoding to the LLR calculator 204. For example, the information may include the results of error-checking and/or error-correcting processes. Additionally, the LLR calculator 204 receives data from NAND Flash memory 201 via input buffer 205. LLR calculator 204 thus determines soft information (e.g., LLR values corresponding to bit values) and provides the soft information to soft decoder 206. Based on the soft information, soft decoder 206 attempts to decode corresponding bit values. Soft decoder 206 also indicates whether its decoding attempt was successful. If the decoding was successful, then the soft decoder 206 provides the decoded bits to the firmware interface output 203.

In some implementations, the NAND Flash memory 201 may be memory cells 101, the hard decoder 202 may be first decoder 102, the LLR calculator 204 may be LLR calculator 103, and the soft decoder 206 may be second decoder 104.

Figure 3:
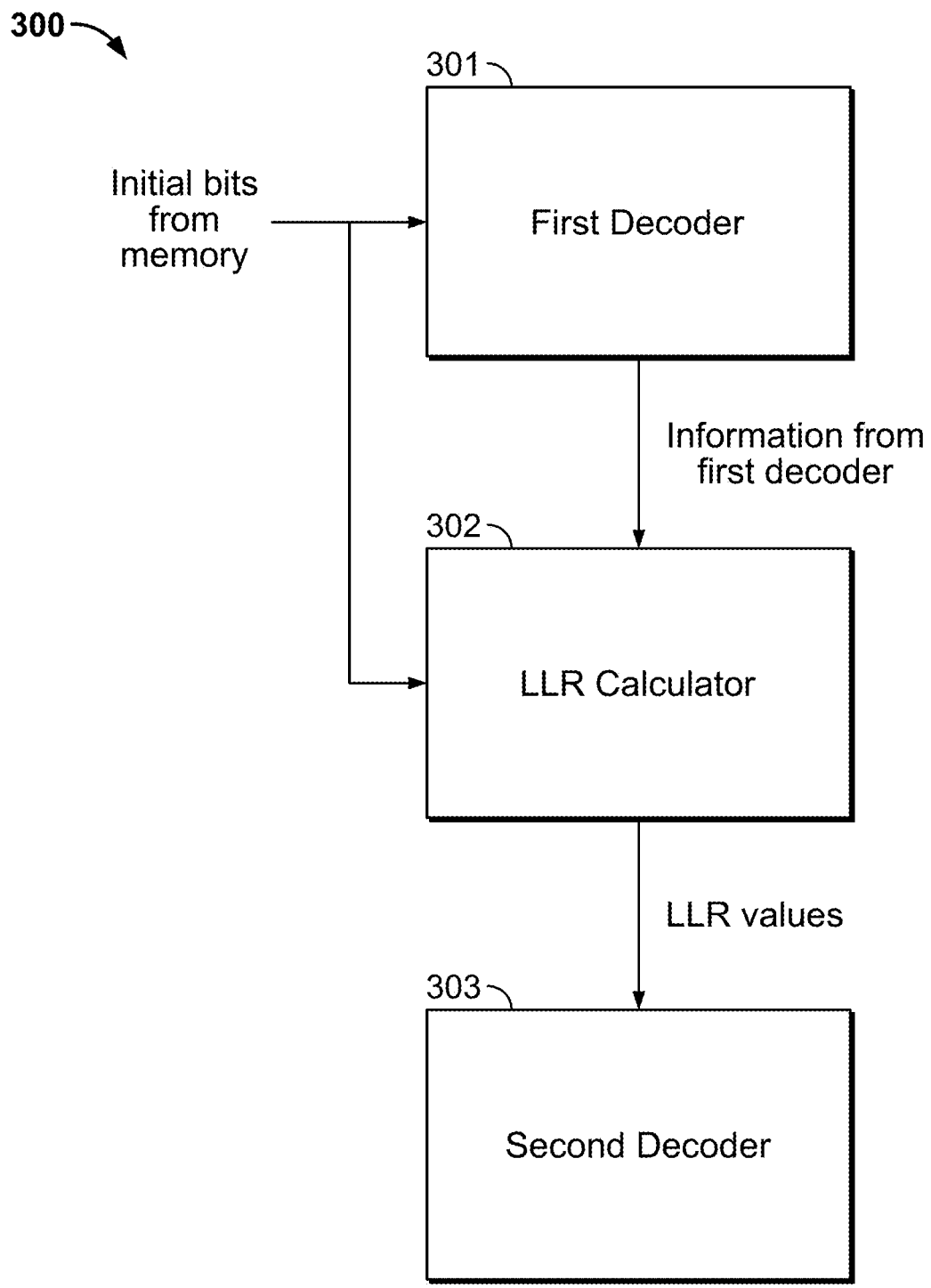
FIG. 3 is a block diagram of a process flow that uses prior information from a decoder to perform a soft decoding, in accordance with implementations of the subject matter of this disclosure.

FIG. 3 is a block diagram of a representative process flow 300 for using information from a first decoder to calculate LLR values on which a second decoder operates. In process flow 300, original data from memory are input to both first decoder 301 and LLR calculator 302. Information from the first decoder 301 is further input to LLR calculator 302. Based on the original data from memory and the information from the first decoder, LLR calculator 302 determines LLR values and provides them to seconder decoder 303.

In some implementations, the original data from memory may be read from memory cells 101 or NAND Flash memory 201, the first decoder 301 may be either of first decoder 102 or hard decoder 202, the LLR calculator 302 may be either of LLR calculator 103 or 204, and the second decoder 303 may be second decoder 104 or soft decoder 206.

Figure 4:
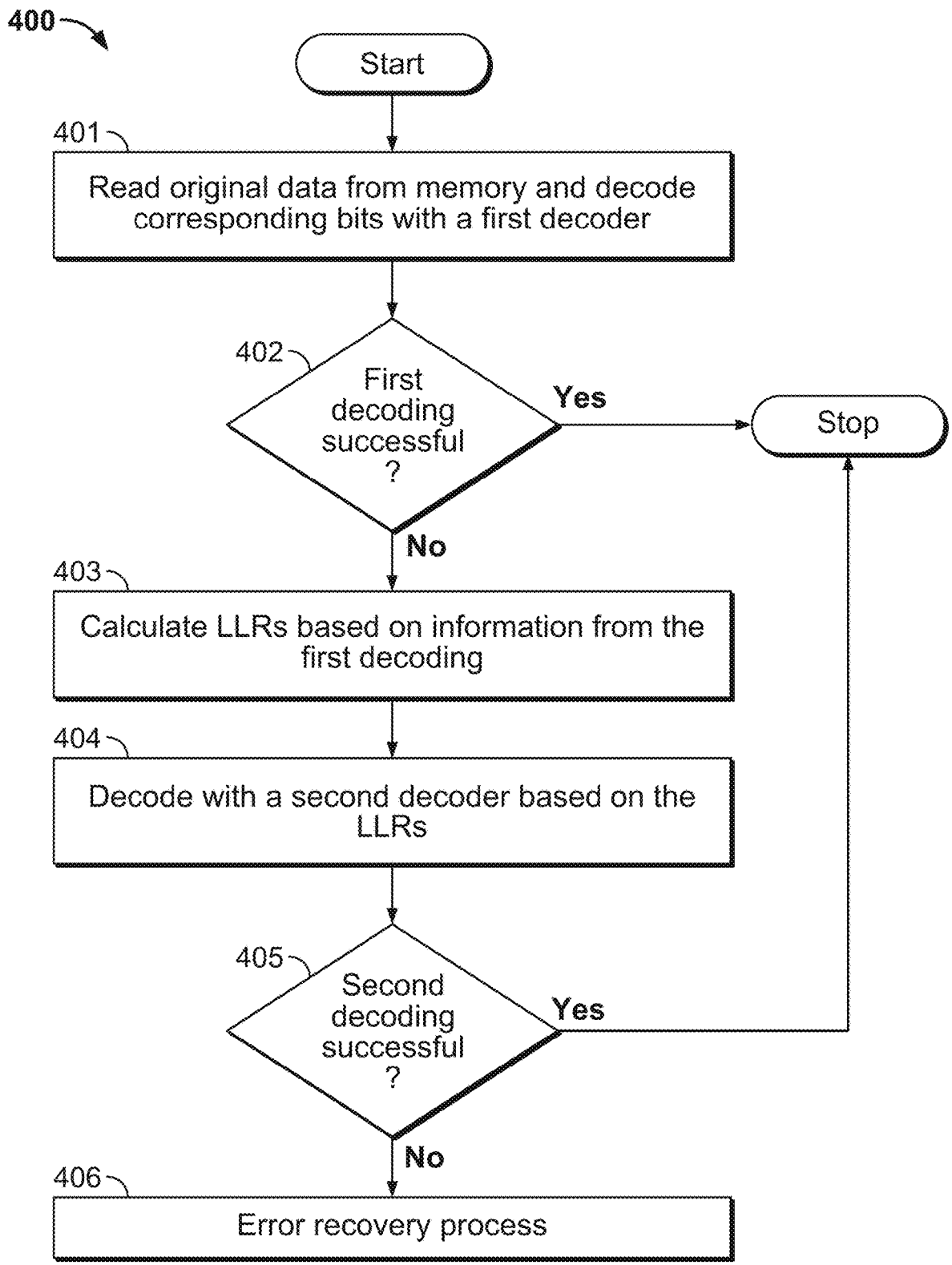
FIG. 4 is a flow diagram of a method for utilizing prior information from a decoder to perform a soft decoding, in accordance with implementations of the subject matter of this disclosure.

FIG. 4 is a flow diagram of a decoding method 400 that, following an unsuccessful decoding, utilizes information from the unsuccessful decoder to perform a subsequent decoding. At 401, the method begins with reading original data from memory (e.g., memory cells 101 or NAND Flash memory 201) and decoding corresponding bit values with a first decoder (e.g., first decoder 102, hard decoder 202, or first decoder 301).

In some implementations, the decoding includes an error-correcting process. In some implementations, the error-correcting process may flip (i.e., change from a '0' to a '1', or vice versa) the value of at least one input bit in the corresponding output of decoded bits (e.g., a flipped bit may be derived from an initial bit by changing its binary value from a '0' to a '1', or vice versa). In addition to decoded bits, the output of the first decoder may include writing a bit vector, which may include a string of binary values indicating whether a respective input bit has been flipped (e.g., based on assigning a '1' to each position in the bit vector that corresponds to a flipped bit). For example, the decoder may flip at least one input bit based on comparing a possible string of decoded bits to a valid codeword, where the valid codeword may be provided by an error-checking process (e.g., based on one or more low-density parity-check codes, turbo codes, polar codes, any other suitable error-checking codes, or any combination thereof).

At 402, the first decoder determines whether the first decoding was successful. In some implementations, the first decoder may use an error-checking process to determine whether the first decoding was successful. For example, the first decoder may determine a syndrome weight based on a comparison between input and output bits of the first decoder or based on a comparison between output bits of the first decoder and a valid codeword. A higher value for the syndrome weight may be indicative of a less reliable decoding. The first decoder may determine whether the first decoding was successful based on comparing the syndrome weight to a predetermined threshold value (e.g., zero or any other suitable threshold value).

If, at 402, it is determined that the first decoding was successful, then the decoding method 400 stops. However, if, at 402, it is determined that the first decoding was unsuccessful, then the decoding method 400 proceeds to 403.

At 403, LLR values are calculated based on information from the first decoding. In some implementations, the LLR values are calculated further based on the original data read from memory. For example, an LLR calculator (e.g., LLR calculator 103, 204, or 302) may calculate initial LLR values based on the original data read from memory. Then, the LLR calculator may calculate adjusted LLR values based on information from the first decoding, as described above and as further described below. After the LLR calculation is completed, the resulting LLR values may be provided to a second decoder.

At 404, the second decoder (e.g., second decoder 104, soft decoder 206, or second decoder 303) decodes the bit values based on the LLR values. In some implementations, the second decoder is a soft decoder and operates on soft information provided as LLR values. The second decoder probabilistically determines bit values for each respective bit based on the probability of the bit being a '0' or a '1', as indicated by the corresponding LLR value. In some implementations, the second decoding may include an error-correcting process, e.g., based on results of an error-checking process indicating that an output of the second decoding did not satisfy a valid codeword check.

At 405, the second decoder determines whether the second decoding was successful. In some implementations, the second decoder may use an error-checking process to determine whether the second decoding was successful. For example, the second decoder may determine a syndrome weight based on a comparison between output bits of the second decoder and a valid codeword, where a higher value for the syndrome weight is indicative of a less reliable decoding. The second decoder may determine whether the second decoding was successful based on comparing the syndrome weight to a predetermined threshold value (e.g., zero or any other suitable threshold value).

If, at 405, it is determined that the second decoding was successful, then the decoding method 400 stops. However, if, at 405, it is determined that the second decoding was unsuccessful, then the decoding method 400 proceeds to the error recovery process at 406.

Though not explicitly shown, the method 400 may be extended after 405 (and before 406) to include additional decoding attempts and additional LLR calculations. Those LLR calculations may be based on at least one of the first decoding 402, the second decoding 405, or any of the additional decoding attempts.

Figure 5:
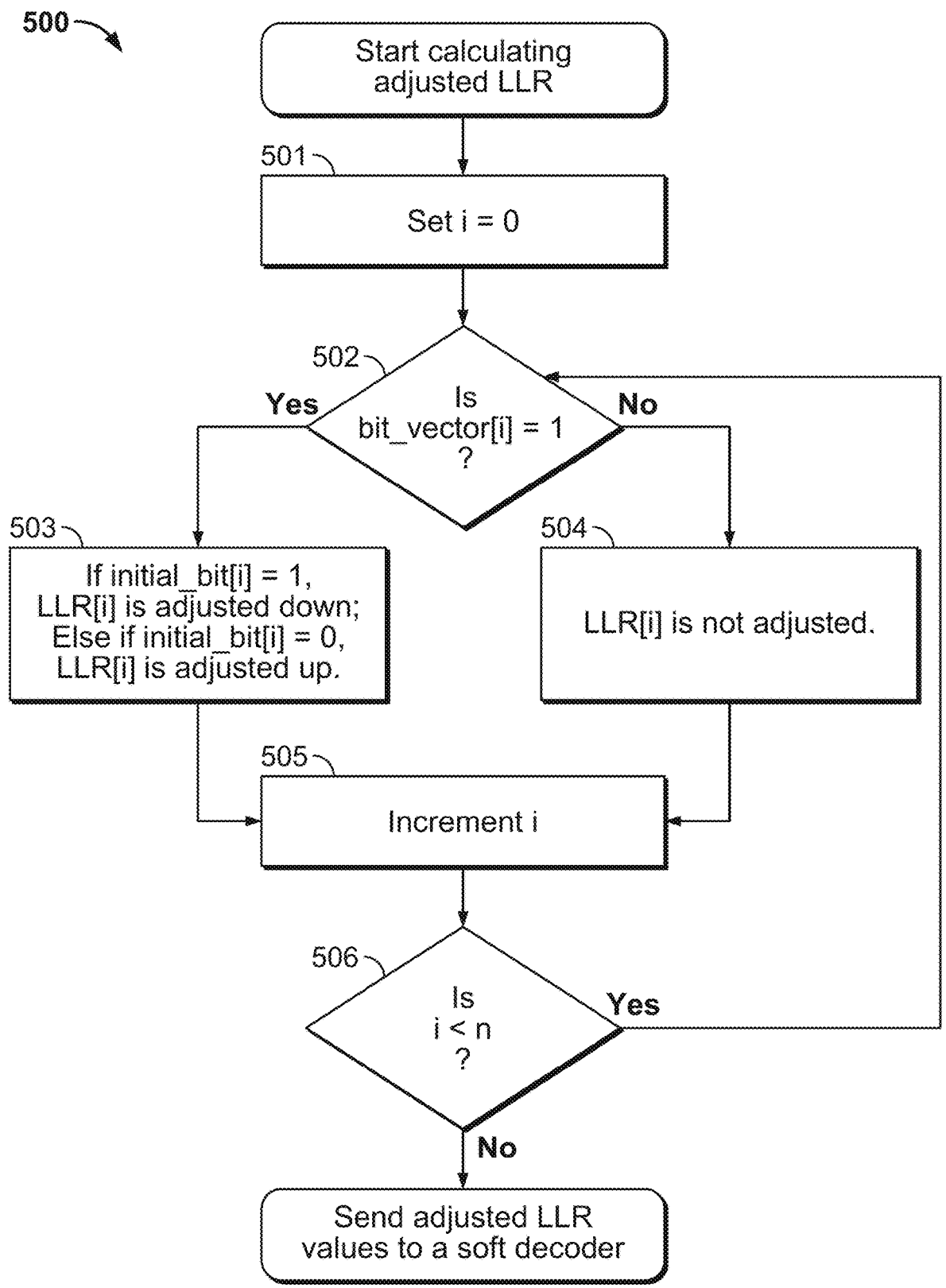
FIG. 5 is a flow diagram of a method for calculating adjusted LLR values based on information from a decoder, in accordance with implementations of the subject matter of this disclosure.

FIG. 5 is a representative flow diagram of an LLR calculation method 500 (e.g., as executed by any of LLR calculator 103, 204, or 302) that utilizes information from a decoder to calculate adjusted LLR values. As used herein, "adjusted LLR values" refers to LLR values that were initially calculated based on original data stored in memory cells and were subsequently adjusted based on data from a decoder that is upstream of the LLR calculator providing the adjusted LLR values.

Calculation method 500 iteratively operates on values of a bit vector (e.g., "bit vector"). The bit vector is a string that encodes binary values indicative of which bits, during decoding by a first decoder, were flipped (e.g., in response to the first decoder determining that the initial bit values were not reliable). The length of the bit vector may be equal to a number of bits being decoded in a given operation, with each bit having a respective position in the vector. The position of a '1' in the bit vector may indicate that the initial bit at that corresponding position was flipped during the first decoding.

At 501, calculation method 500 is initialized by setting incremental counter i=0, where 0 may correspond to an initial position of the bit vector. At 502, it is determined whether the bit vector (of length n) contains a '1' at the position indicated by the incremental counter i. If it is determined that the bit vector does not contain a '1' at the current position, then at 504, the LLR value corresponding to the bit of the current position may not be adjusted.

However, at 502, if it is determined that the bit vector contains a '1' at the position indicated by the incremental counter i, then at 503, the LLR value corresponding to the bit of the current position is adjusted. This adjustment may depend on the initial bit (e.g., "initial bit") value corresponding to the current position. In particular, if the initial bit was decoded as a '1', then the corresponding LLR (which was initially positive) is adjusted down (i.e., closer to an LLR of zero); if the initial bit was decoded as a '0', then the corresponding LLR (which was initially negative) is adjusted up (i.e., closer to an LLR of zero). These adjustments may be similarly characterized as lowering an absolute value of the LLR and thereby determining that the decoded bit value is less reliable based on the corresponding input bit having been flipped in a prior decoding process.

In some implementations, at 503, a magnitude of the LLR adjustment may be determined based on information provided by the first decoder (e.g., a syndrome weight or a number of flipped bits). For example, if a syndrome weight or number of flipped bits (either of which is indicative of a less reliable decoding) is above a predetermined threshold value, then the magnitude of one or more corresponding LLR adjustments may be set to a relatively high value. Conversely, if a syndrome weight or number of flipped bits is below a predetermined threshold value, then the magnitude of one or more corresponding LLR adjustments may be set to a relatively low value.

It will be further understood that the operations at 503 and 504 are illustrative of one implementation of the present disclosure. In other implementations, there may be other processes for adjusting the LLR. For example, the LLR adjustment may include a change of the sign of the LLR value (i.e., from positive to negative, or vice versa). By changing the sign of the LLR, the LLR calculator effectively flips the probable binary value that may be assigned during decoding of the corresponding bit. In some implementations, at 504, the absolute value of an LLR may be increased, e.g., in response to the LLR calculator determining that the input bit is more reliable based on it having not been flipped in a prior decoding process. As with reductions of the absolute value of the LLR, magnitudes of such increases of the absolute value of the LLR may be determined based on a syndrome weight, a number of flipped bits, any other suitable indicator of decoding reliability, or any combination thereof.

At 505, incremental counter i is incremented such that the next bit of the initial bits being decoded from memory may be evaluated. At 506, it is determined whether i is less than n. If it is determined that i is less than n (e.g., not all bits have been evaluated), then the steps 502, 503 or 504, and 505 are repeated. However, at 506, if it is determined that i is not less than n (e.g., all bits have been evaluated), then calculation 500 finishes with the LLR calculator sending the adjusted LLR values to a soft decoder (e.g., second decoder 104, soft decoder 206, or second decoder 303).

Figure 6:
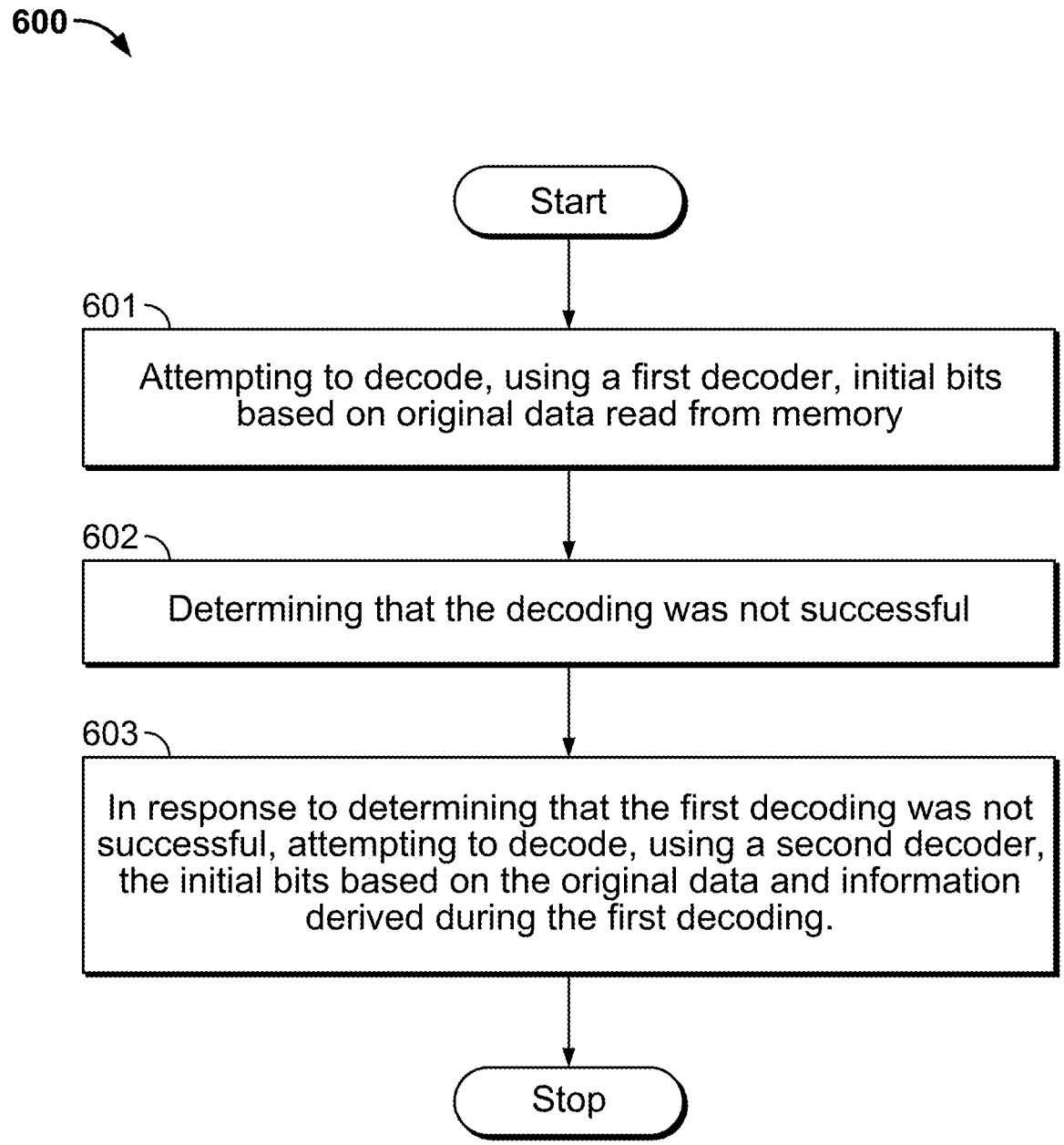
FIG. 6 is a flow diagram of a method for soft decoding based on information from a prior decoding, in accordance with implementations of the subject matter of this disclosure.

FIG. 6 is a flow diagram of a method 600 for decoding bits based on information from a prior decoding. At 601, a first decoder attempts to decode initial bits based on original data read from memory. At 602, it is determined that the decoding was not successful. For example, it may be determined that the decoding was not successful based on determining a syndrome weight during the first decoding and comparing the syndrome weight to a predetermined threshold value. At 603, in response to it being determined that the decoding was not successful, a second decoder attempts to decode the initial bits based on the original data and information derived during the first decoding. For example, the information derived during the first decoding may be a syndrome weight, a bit vector indicative of the results of a bit-flipping procedure, or a combination thereof.

In some implementations, method 600 also includes deriving (e.g., using a soft information calculator) soft information (e.g., LLR values) corresponding to each bit of the initial bits. In some implementations, the soft information may be derived based on at least one of the syndrome weight or the results of the bit-flipping procedure. For example, a value indicative of a probability of an accurate decoding (e.g., the absolute value of an LLR value) may be lowered (e.g., for each flipped bit) or may be raised (e.g., for each not flipped bit) when deriving the soft information, and the magnitude by which the value is raised or lowered may be determined by the syndrome weight.

In some implementations, aspects of the present disclosure may be incorporated into a multi-stage decoder for executing error correction code operations in coordination with a solid-state drive. In some implementations, the solid-state drive may include NAND Flash memory cells, from which data may be read and processed by the hybrid decoder. The multi-stage decoder may be read memory from the solid-state drive via a Flash interface. The multi-stage decoder may be operated by a host controller. The multi-stage decoder may be further coupled to supporting circuitry, the supporting circuitry to process the decoded bits or to invoke a subsequent error recovery procedure in response to an unsuccessful decoding attempt by the multi-stage decoder.

Thus it is seen that an apparatus including a second decoder configured to decode bits based on data from a first decoder, as well as methods for operating the apparatus, including for the decoding of bit values based on data stored in memory, have been provided.

It is noted that the foregoing is only illustrative of the principles of the invention, and that the invention can be practiced by other than the described implementations, which are presented for purposes of illustration and not of limitation, and the present invention is limited only by the claims which follow.

What is claimed is:

1. A method for decoding data in a memory device, the method comprising:
   attempting, using a first decoder, a first decoding of initial bits of original data read from the memory device;
   calculating a syndrome weight indicating existence of incorrect bits in the original data during error checking performed in the first decoding;
   indicating whether at least one initial bit is flipped during error correction performed in the first decoding;
   determining whether the first decoding was successful based on at least one of the syndrome weight and an indication of bit flipping; and
   in response to determining that the first decoding was not successful, attempting, using a second decoder, a second decoding of the initial bits based on:
     the original data, and
     LLR values calculated based on the original data and adjusted based on at least one of the syndrome weight and the indication of bit flipping.

2. The method of claim 1, wherein:
   using the first decoder comprises using a hard decoder; and
   using the second decoder comprises using a soft decoder.

3. The method of claim 1, wherein attempting the first decoding comprises:
   changing at least one initial bit into at least one flipped bit by changing a binary value of the at least one initial bit; and
   writing a bit vector comprising data indicative of which one or more bits of the initial bits were changed into the at least one flipped bit.

4. The method of claim 3, wherein attempting the second decoding comprises attempting to decode the initial bits based on the at least one flipped bit.

5. The method of claim 4, further comprising lowering a value indicative of a probability of an accurate decoding for each bit of the at least one flipped bit.

6. The method of claim 4, further comprising raising a value indicative of a probability of an accurate decoding for each bit other than the at least one flipped bit.

7. The method of claim 1, wherein:
   determining whether the first decoding was successful by comparing the syndrome weight to a predetermined threshold value.

8. A memory device comprising:
   a plurality of memory cells;
   a first decoder configured to:
     decode initial bits based on original data from memory cells;
     calculate a syndrome weight indicating existence of incorrect bits in the original data during error checking performed in the decoding;
     indicate whether at least one initial bit is flipped during error correction performed in the decoding; and
     determine whether the decoding of the initial bits was successful based on at least one of the syndrome weight and an indication of bit flipping; and
   a second decoder configured to, in response to the first decoder determining that the first decoding was not successful, decode the initial bits based on:
     the original data, and
     LLR values calculated based on the original data and adjusted based on at least one of the syndrome weight and the indication of bit flipping.

9. The memory device of claim 8, wherein the first decoder is a hard decoder and the second decoder is a soft decoder.

10. The memory device of claim 8, wherein the first decoder is further configured to:
    change at least one initial bit into at least one flipped bit by changing a binary value of the at least one initial bit; and
    write a bit vector comprising data indicative of which one or more bits of the initial bits were changed into the at least one flipped bit.

11. The memory device of claim 10, further comprising:
    a soft information calculator configured to derive soft information based on the at least one flipped bit derived by the first decoder;
    wherein the second decoder decodes the initial bits based on the soft information.

12. The memory device of claim 11, wherein the soft information calculator is further configured to lower a value indicative of a probability of an accurate decoding for each bit of the at least one flipped bit.

13. The memory device of claim 11, wherein the soft information calculator is configured to raise a value indicative of a probability of an accurate decoding for each bit other than the at least one flipped bit.

14. The memory device of claim 8, wherein the first decoder is further configured to:
    determine whether the decoding was successful by comparing the syndrome weight to a predetermined threshold value.

* * * * *